United States Patent [19]

Byrnes et al.

[11] Patent Number: 5,150,040
[45] Date of Patent: Sep. 22, 1992

[54] DUAL-MODE Z-STAGE

[75] Inventors: Herbert P. Byrnes, Poughkeepsie; Richard Wahl, Fishkill, both of N.Y.

[73] Assignee: International Business Machines Corporation, Armonk, N.Y.

[21] Appl. No.: 601,490

[22] Filed: Oct. 22, 1990

[51] Int. Cl.[5] .......................... G01R 31/02; B23Q 3/18
[52] U.S. Cl. ................................... 324/158 F; 269/60
[58] Field of Search .............. 324/158 F, 158 P, 73.1; 269/55, 56, 60, 71, 309; 414/609, 749

[56] References Cited

U.S. PATENT DOCUMENTS

| | | | |
|---|---|---|---|
| 4,534,695 | 8/1985 | Stump et al. | 414/749 |
| 4,560,880 | 12/1985 | Petric et al. | 250/441.1 |
| 4,770,531 | 9/1988 | Tanaka et al. | 356/358 |
| 4,856,641 | 8/1989 | Matsumura et al. | 198/346.2 |

FOREIGN PATENT DOCUMENTS 0063289 10/1982 European Pat. Off. .

OTHER PUBLICATIONS

Odhams Practical and Technical Encyclopedia; Odhams Press Limited, London, England; pp. 328, 329; Publisher Prior to 1959; copy in Group 260.

*Primary Examiner*—Ernest F. Karlsen
*Attorney, Agent, or Firm*—Graham S. Jones, II

[57] ABSTRACT

A dual mode Z/Theta stage supports and moves a work piece such as a semiconductor wafer into position for positioning during testing. The Z/Theta stage has a peripheral four point elevator drive. The elevating suspension comprises parallel, vertically oriented, rigid lift pins which bear the weight of a top-plate. The lift pins are located about the periphery of the stage to provide stability of the support. The top plate essentially floats on the lift pins so that virtually no frictional forces are translated to lift pins. The lift pins are elevated together by the force of four matched pin lift levers, crank arms. The crank arms are driven by downward force from a vertically translating air piston which is in contact with the crank arms 31. The air piston provides a gentle force moderated by pneumatic pressure which can moderate the full force of a stepping motor which drives it.

10 Claims, 6 Drawing Sheets

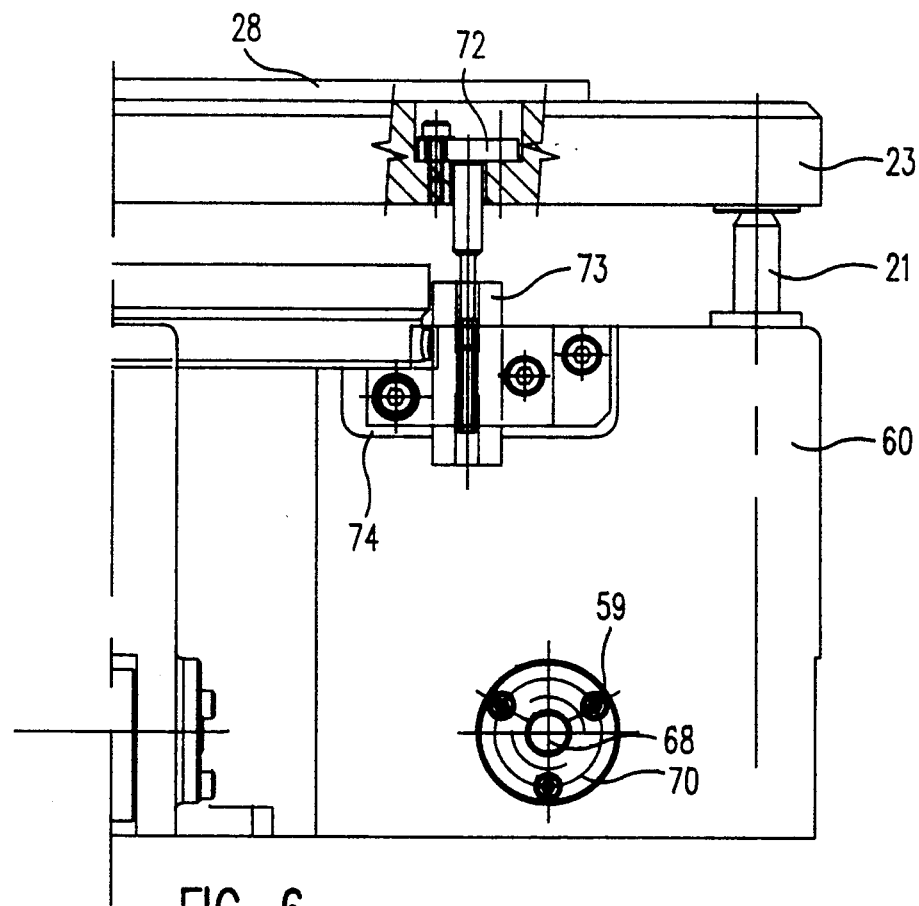
FIG. 6
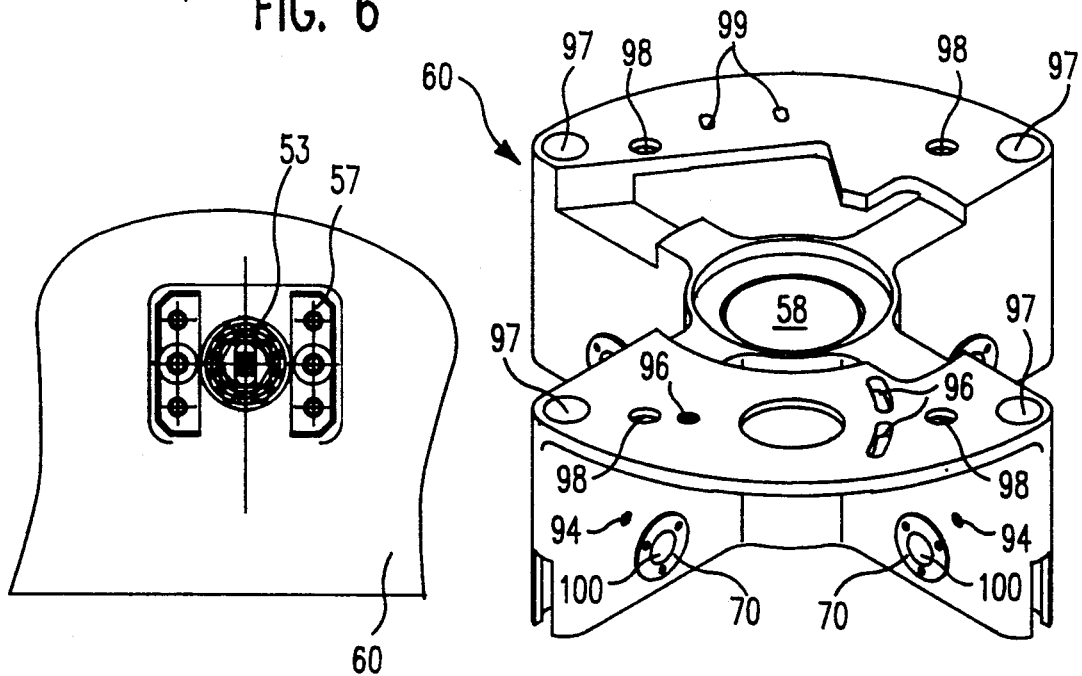
FIG. 7
FIG. 8

DUAL-MODE Z-STAGE

BACKGROUND OF THE INVENTION

1. Field of the Invention

This invention relates to article handling devices and more particularly to support means for moving a work piece into position. This apparatus is suitable particularly for positioning of semiconductor wafers during testing.

2. Description of Related Art

Testing of circuits on wafers involves supporting the chips in wafer form on a top plate on a support usually in the form of a single column, known as a Z stage. FIG. 1 shows a schematic diagram of a prior art type of Z stage 10 in which the entire Z stage 10 is carried by and secured to a support 11 below it, which moves in the X and Y directions and includes an elevator column 12 for moving a top plate 14 up and down, in the Z direction. The elevator column 12 comprises a single central supporting column in the form of an axle usually as the sole support located centrally under the top plate 14. The column 12 is supported for sliding lengthwise by bearing 13 which introduces friction caused by probing by probe 15, particularly near the edge of a wafer being tested, resting on the top plate 14 as well, when the probe 15 is testing near the periphery of the top plate 14. Bearing 13 is fastened to support 11. In addition, the probe 15 causes excessive deflection of the elevator column 12 when it contacts wafers, near the periphery of the top plate.

U.S. Pat. No. 4,534,695 of Stump, et al. "Wafer Transport System" shows a wafer supported by four quartz rods in a lift for an annealing system. It does not support the work at the periphery or for anything other than light treatment or deposition, since there is very little support for the wafer.

U.S. Pat. No. 4,558,984 of Garrett for "Wafer Lifting and Holding Apparatus" shows an elevator system for wafers.

U.S. Pat. No. 4,560,880 of Petric et al., for an "Apparatus for Positioning a Workpiece in a Localized Vacuum Processing System" shows a Z-stage supported above a set of three hydraulic actuators 28 in FIGS. 1 and 3. The actuators 28 are bellows which are pressurized by a hydraulic controller 70 which is driven by a linear stepper motor 80 which adjusts the pressure to all three of the actuators as a function of feedback from a gap sensor. There are three spring assemblies 94 composed of a flanged pin 98 extending down from the Z stage and a spring in a cup 96 on the X-Y table. In addition, there is a central post 86 which is attached rigidly to the X-Y table 56 and a flexible sheet 88 secured to the Z stage.

U.S. Pat. No. 4,528,451 of Petric et al. for "Gap Control System for Localized Vacuum Processing" describes a wafer handling system for a particle beam system, E-beam or ion-beam lithography systems or an ion implanter. Several piezoelectric devices are used to provide Z-motion of the wafer. A piezoelectric element 76 is mounted at one end to a support bracket 78. The opposite end of the element 76 bears against one arm of a lever 80. The other arm of the lever 80 is coupled through a pin 82 to a vacuum chuck 18. The lever 80 pivots about a flexible web 84 connecting the lever 80 to a support block 86. The material of the flexible web 84 can be beryllium copper. The lengths of the arms of the lever 80 can be designed to provide the required amount of z-axis motion. The support block 86 and the support bracket 78 are mounted to the stage 24. When the piezoelectric element 76 is energized by an electrical signal, it increases or decreases in length. The change in length is converted by the lever 80 into vertical, or z-axis, movement of the vacuum chuck 18. Alternatively, a Burleigh "inch worm" piezoelectric element can be utilized.

The drives of Petric et al patents are not as strong as a hydraulic drive and the linkages are not as simple or as coordinated as is desirable.

SUMMARY OF THE INVENTION

In accordance with this invention a apparatus is provided for positioning a work piece along the Z axis in an X, Y and Z axis system comprising, a work supporting element supported by means adapted for moving said work supporting element along the Z-axis with respect to a main support member. The means for moving includes a set of vertical elevator elements comprising, 1) a reciprocable linear drive and 2) support shafts carried reciprocably by cooperating bearing members, the bearing members being secured to the main support member, with the support shafts being supported by the bearing members for vertical, reciprocable sliding up and down within the bearing members. Each of the support shafts has an actuator end. The other end of each of the support shafts is coupled at a different point to the work supporting element.

Preferably the different points of support are widely spread about the periphery of the work supporting element and the elevator elements located beneath the periphery of the work supporting element.

Another preferred aspect of the apparatus for positioning a work piece includes a motor secured to the X-Y support, and a linkage between the motor and the actuator ends of the support shafts.

In another aspect of this invention apparatus is provided for positioning a work piece along the X, Y and Z axes comprising, an X-Y work supporting surface supported by means for adapted for X-Y movement in a plane perpendicular to the Z-axis. A Z stage is carried upon the X-Y support. A Z-plate is supported by means reciprocable along the Z axis including, a) a vertical drive shaft reciprocating along the Z axis below the Z plate connected to the X-Y support, b) a motor linked to drive the vertical drive shaft, c) a set of crank arms having the crank end of etch thereof engaged with the vertical drive shaft for providing cranking motion parallel to the Z axis, each of the crank arms having an output end distal from the crank end, and d) a set of elevator shafts with each of the elevator shafts supported at one end on the output end of a crank arm and at the other end the elevator shafts supporting the Z-plate. The elevator shafts being guided by bearing means secured to the X-Y support for elevator action to raise and lower the Z-plate in response to the motor.

BRIEF DESCRIPTION OF THE DRAWINGS

FIG. 6 is an elevational detail view of a an actuator linear transducer for measuring the position of the stage.

FIG. 7 is an elevational detail view taken along line 7—7 in FIG. 5.

FIG. 8 is a perspective view of the top of the casting of the body of the stage shown in FIGS. 2-7.

DESCRIPTION OF THE PREFERRED EMBODIMENT

Figure 2:
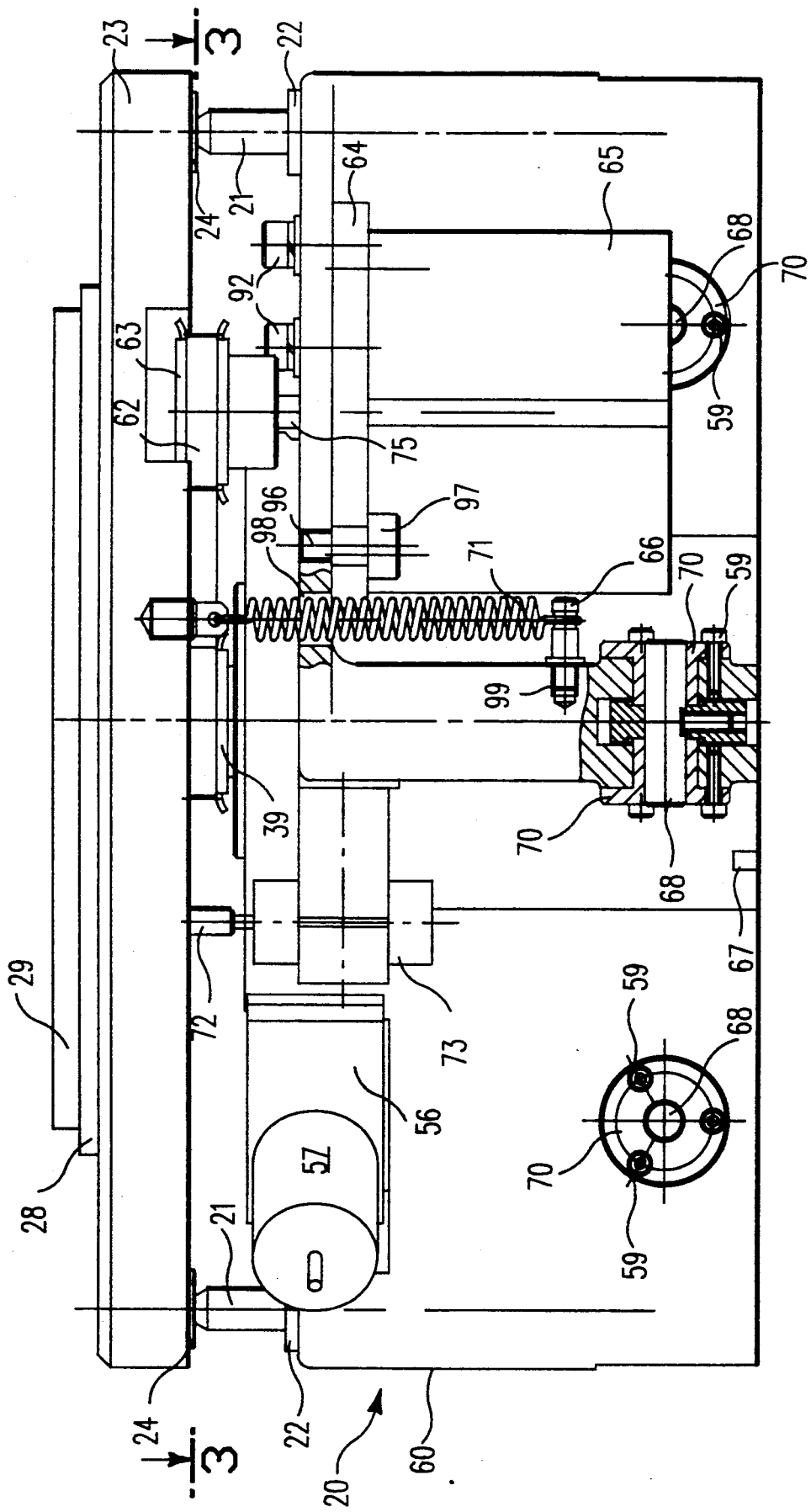
FIG. 2 shows an elevational view of Z/Theta stage 20 which has a peripheral multiple point elevator drive and a suspension comprised of parallel, vertically oriented lift pins in accordance with this invention.

In this invention, FIG. 2 shows a Z/Theta stage 20 which has a peripheral four point elevator drive (a plurality of drives such as three point or five point drives, etc. are possible as well) and a elevating suspension comprised of parallel, vertically oriented, rigid lift pins 21. Pins 21 bear the weight of a top-plate 23 (preferably aluminum, which is PTFE impregnated for protection.)

Figure 1:
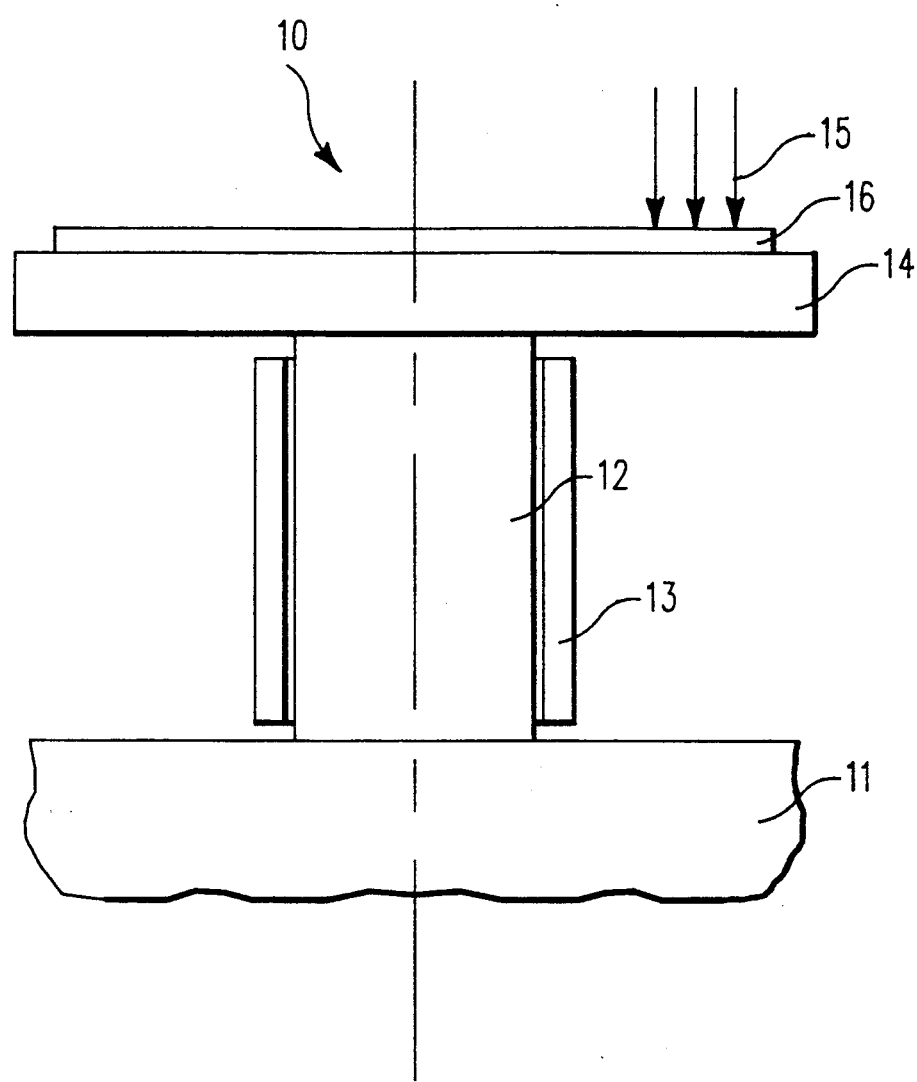
FIG. 1 is a schematic diagram of a prior art type of Z stage in which the entire Z stage is carried by a support below it, which moves in the X and Y directions and includes an elevator column for moving a top plate up and down, in the Z direction.
Figure 4:
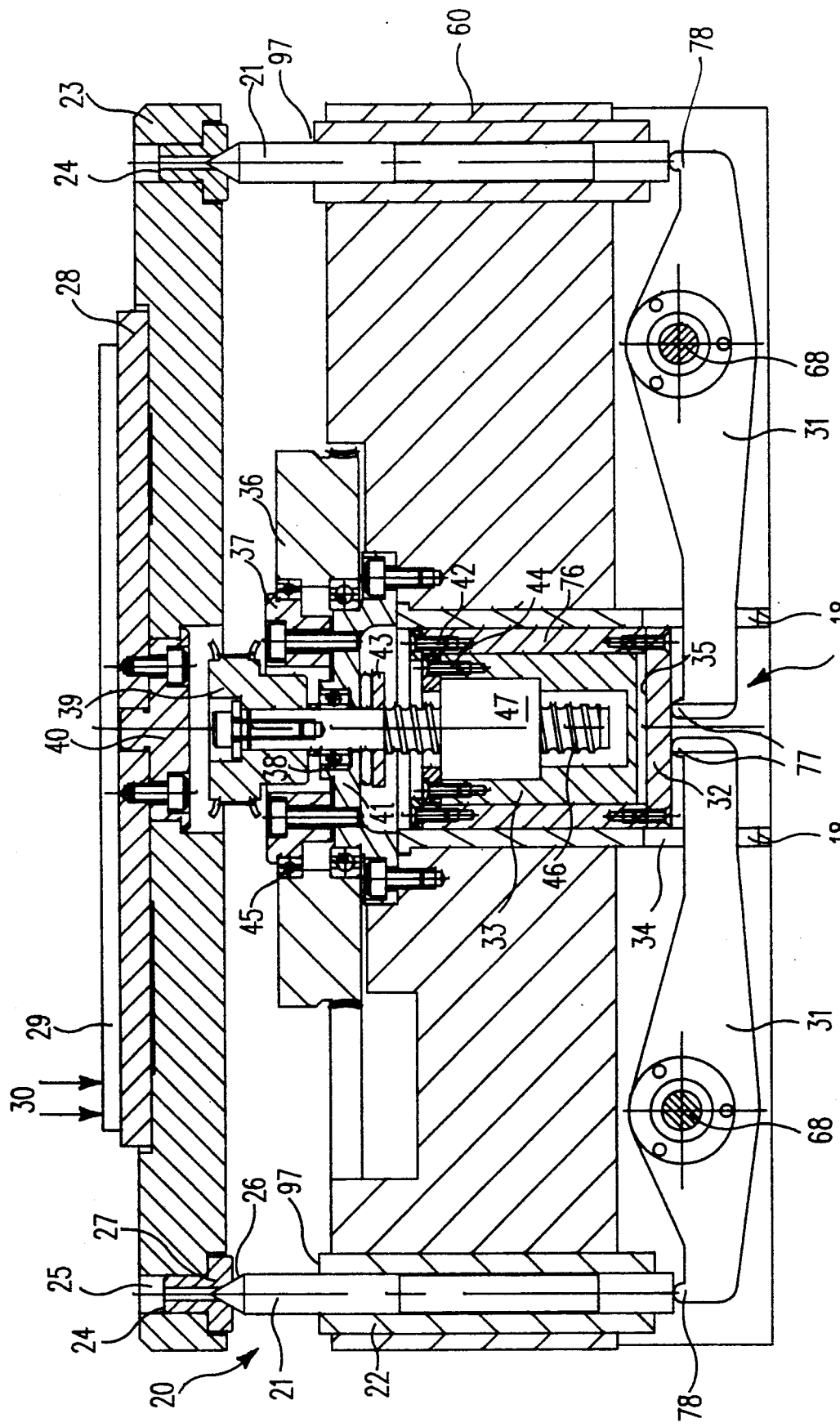
FIG. 4 is a sectional elevation view taken along line 4—4 in 3.

Referring to FIGS. 2 and 4, lift pins 21 are carried in upright, press-fit bushings 22 in bores 97 in a casting 60, and pins 21, bushings 22 and bores 97 are located about the periphery of the stage 20 to provide greater stability of the support afforded by the lift pins 21. The lift pins 21 (preferably composed of drill rod plated with chromium, located on the periphery of the stage 20) engage with and support inverted brass, pin cups 24 located in vertical holes 25 in the bottom of the top plate 23, near its periphery. The lift pins 21 preferably have machined, pointed, conical upper ends 26 which fit conformingly into matching downwardly directed counterbores 27 in the cups 24. The lift pins 21 are distributed about beneath the periphery of the top plate 23. The top plate 23 including cups 24 essentially floats on the lift pins 21 so that virtually no frictional forces are translated to lift pins 21. This contrasts to the prior art stiction and cocking of the central bearings of FIG. 1 which cause lack of control of the contact force during testing. In summary, the top plate 23 is carried by a four point suspension by the four supporting pins 21, which are basically and substantially not bent or deflected laterally at all by the pressure of the testing probe 30 within the parameters required to produce stiction or cocking which would interfere with the operation of the stage 20.

Threaded studs 61 (FIG. 2) are secured to the bottom surface of the top plate 23 at its edge to secure the upper ends of extension springs 71 which pass through holes 98 in the flat top surface of casting 60. The lower ends of springs 71 are connected to spring pins 66 threadedly fastened into holes 94 in the sides of casting 60 shown in perspective in FIG. 8 to hold the top plate 23 onto the stage assembly, i.e. pins 21 and casting 60, etc. The extension springs 66 serve the purpose merely of retaining the top plate 23 in position with respect to the main body, i.e. casting 60, etc.

The lift pins 21 are elevated together by the force of four matched pin lift levers 31 (referred to as crank arms 31, which are preferably composed of tool steel with a chromium flash), which rotate about pivot pins 68 (preferably composed of drill rod with a flash of chromium). Each pivot pin 68 is secured in position by a pair of pivot bushings 70 (in holes 100 through body casting 60 FIG. 8) which are secured onto opposite sides of the body casting 60 by screws 59. The crank arms 31 are driven by downward force from a vertically translating air cylinder cap 32 which is in contact with the crank arms 31. The force upon the air cylinder cap 32 will be explained next, starting from the source which eventually generates pressure on air cylinder cap 32.

The Z-stage accommodates deflecting probes which do not require a gentle force moderated by pneumatic pressure and constant-force rigid probes which can accommodate the full force of the stepping motor 65 only with the protection afforded by pneumatic pressure.

Referring to FIGS. 2 and 4, the general concept of the transmission of force from the stepping motor to the crank arms 31 is that the stepping motor 65 turns a belt 63 which turns the lead screw 46 which via lead nut 47 drives a piston 33 down within an air cylinder 76, which in turn is a combined air cylinder-piston 76 with a cylinder cap 32 (acting as the base of the outer cylinder piston) which bears down upon the crank arms 31. A more detailed explanation of this general concept follows next.

Figure 3:
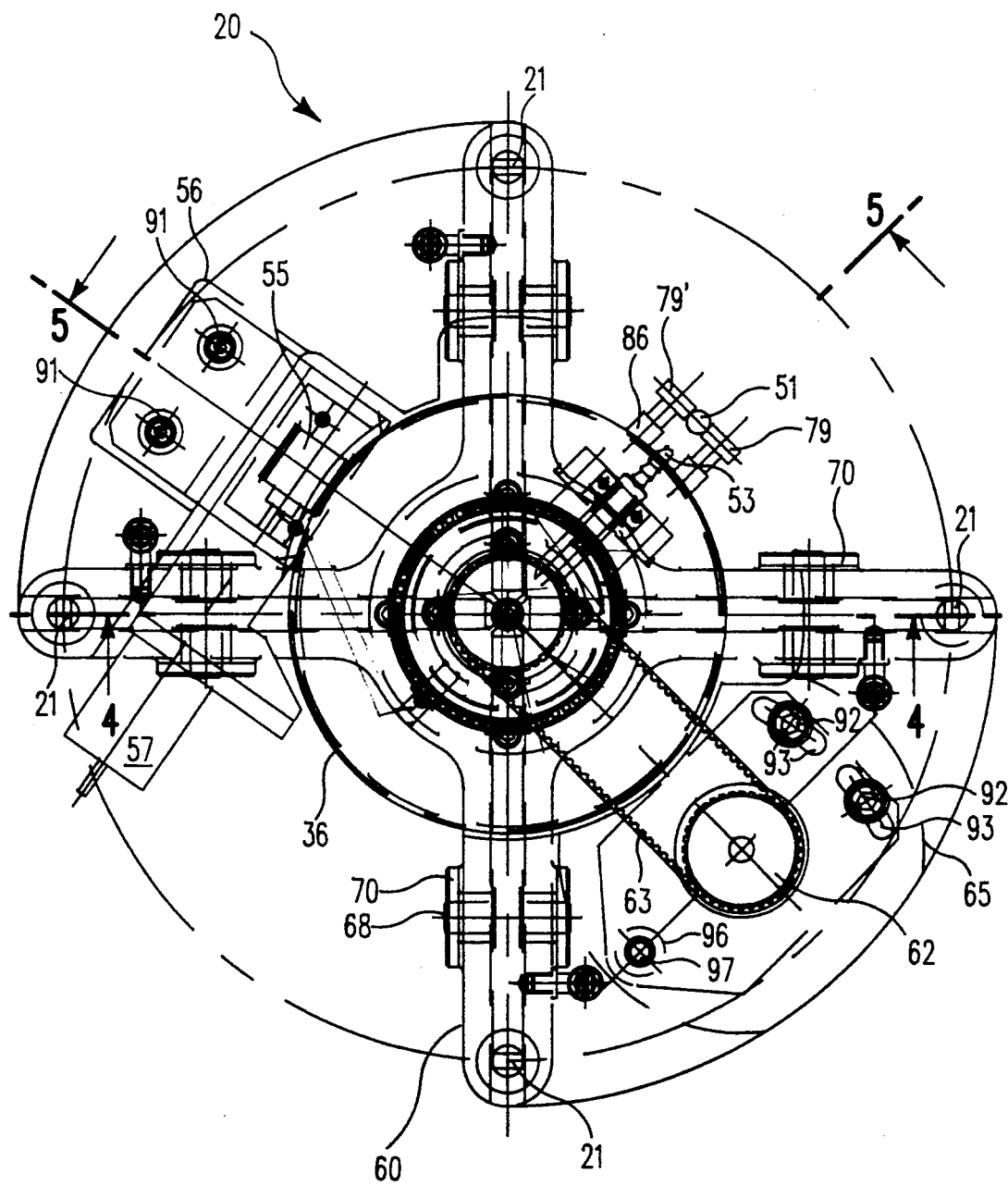
FIG. 3 is a sectional plan view taken along line 3—3 in FIG. 2.
Figure 5:
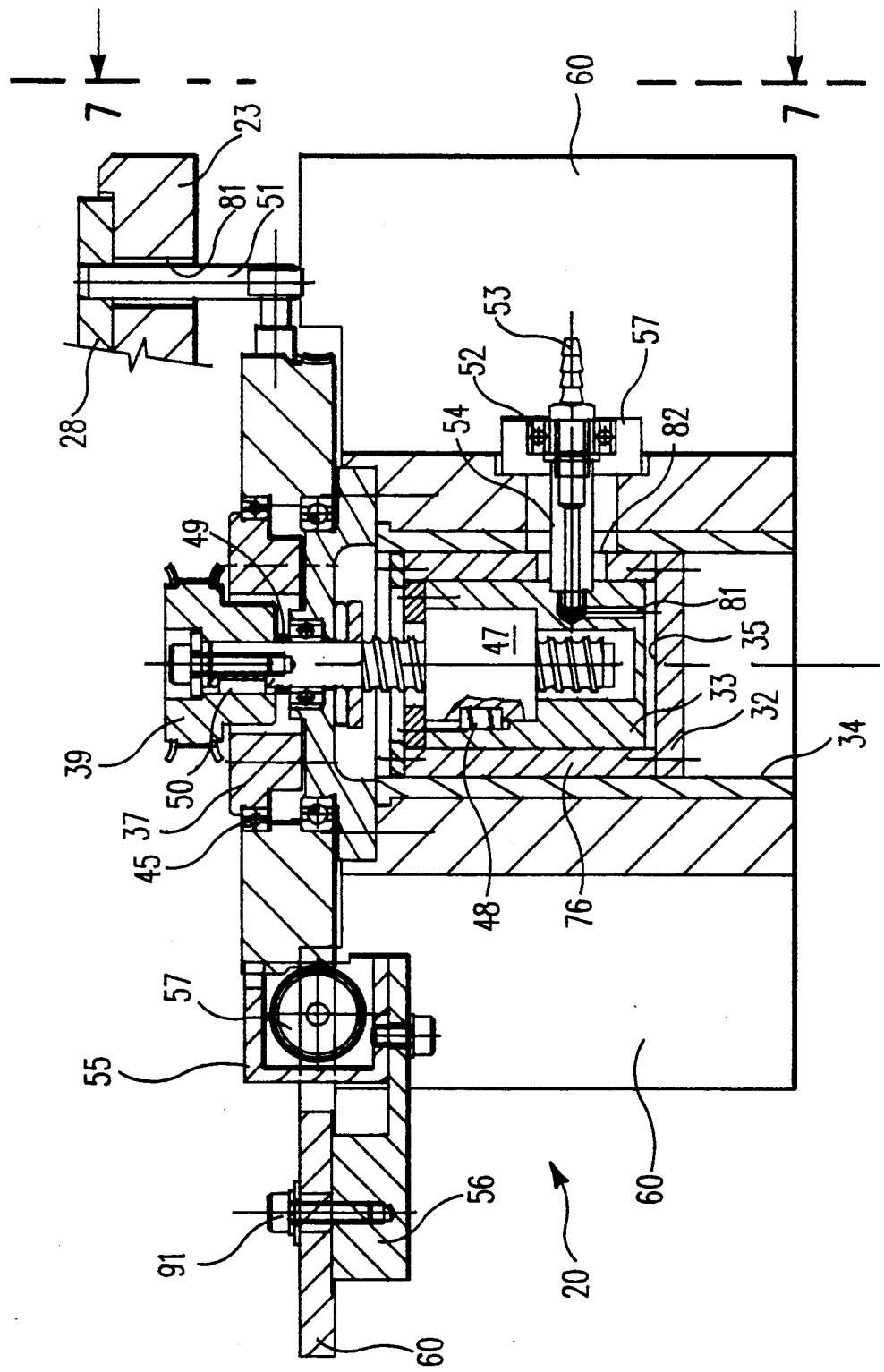
FIG. 5 is a sectional elevation view taken along lines 5—5 in FIG. 3.

The body casting 60 is shown in partial elevation in FIG. 6 and in perspective in FIG. 8 with most parts of the stage removed for convenience of observation. The casting 60 is composed preferably of almag #35 sandblasted and anodized and stress relieved before machining. Referring to FIGS. 2 and 3, casting 60 carries a main, stepping motor 65 upon motor mounting plate 64 seen in FIG. 2. Mounting plate 64 is secured to casting 60 by threaded bolt 97 which is received by threaded bore 96 in casting 60. Motor 65 has a shaft 75 extending upwardly through hole 95 in casting 60 to timing belt pulley 62 affixed to shaft 75 for driving a timing belt 63. The motor mounting plate 64 is positioned to exert a tension force on belt, which position of plate 64 is maintained by bolts 92 which pass through adjustment slots 93 in casting 60 to fasten mounting plate 64 securely to casting 60. The belt 63 passes about a timing belt pulley 39 (preferably with grooves) which rotates coaxially about the axis of lead screw driver 46 in FIG. 4. Pulley 39 is mounted upon lead screw 46 and secured thereto to rotate screw 46 in unison therewith by rounded end key 50 (FIG. 5.) Thus, when pulley 39 turns lead screw driver 46, driver 46 in turn drives a lead screw nut 47 connected to lead screw piston 33 by special key 48 (shown in FIG. 5 fitting into confronting slots in piston 33 and nut 47) forcing the lead-screw-piston 33 to ride up and down within slideable air cylinder (piston) 76, which in the same way rides up and down within main bushing 34. Main bushing 34 has been inserted into a cylindrical bore 58 within body casting 60. Note that key hole shaped slots 18 (FIG. 4) are formed in main bushing 34 for each of the lift pin levers 31 to extend therethrough. Main bushing key 67 (FIG. 2) is inserted into a slot in the base of body casting 60 and secured threadedly by a machine screw to hold main bushing 34 in cylindrical bore 58. Cylindrical-nut-hold-ring 44 is threadedly fastened to piston 33. Ring 44 is smaller in ID than the OD of lead screw nut 47, thereby retaining the lead screw nut 47 in position within piston 33. An air piston formed of slideable air cylinder 76 capped with air housing flange 42 and closed off at its base with air cylinder cap 32 comprises an additional multiple piece outer piston, within bushing 34 in bore 58, surrounding lead-screw-piston 33. Air housing cylinder 76 and cap 32 translate reciprocally downwardly and upwardly within main bushing 34 in response to forces exerted by the air pressure within air chamber 35 between the base of lead screw piston 33 and the air cylinder cap 32. The system can operate if there is no air pressure applied to air chamber 35, where the testing probes 30 do not require the shock absorbing protection of a pneumatic air chamber 35. Pressure can be maintained in air chamber 35 which is preferably maintained at a pressure of about 40 to 80 psi for testing probes 30 which deflect. In that case pressure is transmitted from lead-screw-piston 33 through the pressure of air chamber 35 when the lead-screw-piston 33 drives downwardly under the force exerted by motor 65, as explained above. The air cylinder cap 32, when driven down, bears down upon the inner nubs 77 of the crank arms 31. The opposite ends of the crank arms contact the lower end of the lift pins 21 with the nubs 78, located below the lift pins 21. The upper ends of lift pins 21 exert force on the lower surface of the top plate 23 (platform) beyond the outer edges of the work pieces to avoid pivoting of the floating work supporting surface of the Z-stage.

The air housing flange 42 (FIG. 4) is smaller in inner ID than the OD of the lead screw piston 33, thereby providing an upper end to the cylinder within which piston 33 reciprocates.

The air pressure to the air chamber 35 is supplied from air hose fitting 53 (FIGS. 5 and 7) to antirotation-precision-bearing 52 through hollow bearing support rod 54 which extends through an opening 82 in the side of slideable air cylinder 76 into the side of lead-screw piston 33. The bearing 52 is held in position by bearing guides 57 (FIG. 7) which prevent rotation, but permit the bearing and rod 54 to ride up and down with air cylinder 33. Referring to FIG. 5, the air pressure passes from fitting 53 through hollow rod 54, and through orifice 81 through housing 33 down to air chamber 35.

A round, rotary, theta plate 28 is carried on top of the top plate (z-plate) 23 as shown in FIG. 4 in section. The theta plate 28 is adapted for rotation about its vertical axis through angle theta. The top plate 23 supports this rotatably mounted round theta plate (platform) 28 holding a wafer 29 to be tested. The top plate 23 includes a coaxial hollow central space which carries center pivot 40 (preferably composed of brass) which is bolted to the lower surface of the theta plate 28 which is vertically coaxial in FIG. 4 with plate 23 and pivot 40. The drive for rotation through angle theta will be discussed next.

Referring to FIGS. 3 and 5, theta drive motor 57 is secured by a mounting plate 56 (preferably composed of aluminum) to a standard, commercially available theta drive assembly 55 (FIG. 5), which in turn is secured to body casting 60 by bolts 91 in holes 99. The motor 57 has a shaft (not shown) and a drive gear (not shown) which contact the periphery of theta drive gear 36 to rotate it to a desired angular position. Referring to FIG. 4, the theta drive gear 36 is rotatably mounted on the outer race of bearing 45 having its inner race secured to a clamp ring 37 bolted to bearings mount 41 which, in turn, is bolted to the body casting 60. Bearings mount 41 is an intermediate bearing supporting member which carries several bearings including bearing 45.

Pulley 39 is separated from precision bearing 38 by pulley spacer 49.

Referring to FIG. 3, the theta drive gear 36 includes a pair of ball bearings 79 mounted on eccentric bearing support pins 80 on the periphery of gear 36. The outer races of the ball bearings 79 are juxtaposed with a dowel pin 51 pressed (as shown in FIG. 5) into the lower surface of the round theta plate 28. The pin 51 extends downwardly from theta plate 28 through annular slot 81 (FIG. 5) in top plate 23, so that the theta gear, as it rotates, turns the round theta plate 28 about its axis by pushing either one of the bearings 79 (depending upon the direction of rotation) against pin 51 to turn theta plate 28, without turning the top plate 23.

Precision bearing 38 is shown in FIG. 4 between worm screw 46 and bearing mount 41 which is bolted to the body casting 60 coaxially with the main bushing 34 above the top of cylinder bore 58. Bearing 38 supports the worm screw 46 for rotation about its axis. Thrust bearing 43, which absorbs axial forces, is also located below the bearing mount 41 within the top of cylinder bore 58, above the air cylinder and the lead-screw piston 33.

FIG. 6 shows a partial elevation of the body casting 60 with transducer actuator 72 secured by a threaded fastener within a bore in the surface of the top plate 23. Actuator 72 has a shaft extending down through a hole in the bottom of plate 23 into mechanical linkage with series transducer 73 which is an LVDT and an RVDT, secured to the side of body 60 by transducer mounting block 74 by threaded fasteners.

What is claimed is:

1. Apparatus for positioning a work piece along the Z axis in an X, Y and Z axis system comprising,
   a positioning system with X, Y, and Z axis motion,
   a work supporting element (23) extending horizontally in a plane defined by said X and Y axes, said element (23) being supported by a vertically extending lift means for moving said work supporting element (23) vertically along said Z-axis with respect to a main support member (60),
   said lift means including a vertical elevator system comprising,
   1) a reciprocable vertical linear drive (41, 32),
   2) a plurality of vertically extending support shafts (21) carried reciprocably by cooperating bearing members (22), said bearing members (22) being secured to said main support member (60), with said support shafts (21) being supported by said bearing members (22) for vertical, reciprocable sliding up and down within said bearing members (22), each of said support shafts (21) having an actuator end, the other end (26) of each of said support shafts (21) being coupled at a different point to said work supporting element (23) for supporting a portion of the weight thereof,
   3) crank means for connecting forces to elevate said support shafts from said linear drive,
   4) said support shafts driving said work supporting element 23 up in response to force from crank means in response to said vertical linear drive.

2. Apparatus for positioning a work piece along the X, Y and Z axes in accordance with claim 1, including said different points being widely spread about the periphery of said work supporting element (23) and said support shafts (21) of said elevator elements being located beneath the periphery of said work supporting element (23).

3. Apparatus for positioning a work piece along the X, Y and Z axes in accordance with claim 2, including
   a motor (65) secured to said X-Y support, and
   a linkage (62), (39), (31) between said motor (65) and said actuator ends (78) of said support shafts (21).

4. Apparatus for positioning a work piece along the X, Y and Z axes comprising,
   an X-Y work support (60)

a Z-plate (23) supported by means reciprocable along said Z axis including,
  a) a vertical drive shaft (32) reciprocating along said Z axis below said Z plate (23) connected to said X-Y support (60),
  b) a motor (65) linked to drive said vertical drive shaft (32),
  c) a set of crank arms (31) having the crank end (77) of each thereof engaged with said vertical drive shaft for providing cranking motion parallel to said Z axis, each of said crank arms (31) having an output end (78) distal from said crank end (31), and
  d) a set of elevator shafts (21) with each of said elevator shafts (21) supported at one end on said output end of a crank arm (31) and at the other end (26) said elevator shafts (21) supporting said Z-plate (23), said elevator shafts (21) being guided by bearing means (22) secured to said X-Y support for reciprocal elevator action to raise and lower said Z-plate (23) in response to said motor (65).

5. Apparatus for positioning a work piece along the Z axis in an X, Y and Z axis system comprising,
an X, Y, Z axis system,
said apparatus including a work supporting element (23), said element (23) being supported by lift means for moving said work supporting element (23) vertically along said Z-axis with respect to a main support member (60),
said lift means providing a vertical elevator system comprising,
  1) a single reciprocable vertical linear drive (41, 32) and
  2) a set of vertically extending support shafts (21) carried reciprocably by cooperating bearing members (22), each of said support shafts (21) having machined, pointed conical upper ends (26), each of said upper ends (26) being coupled at a different point to said work supporting element (23) for supporting a portion of the weight thereof, said different points being widely spread about the periphery of said work supporting element (23) and said support shafts (21) of said elevator elements being located beneath the periphery of said work supporting element (23),
  3) said bearing members (22) being secured to said main support member (60), with said support shafts (21) being supported by said bearing members (22) for vertical, reciprocable sliding up and down within said bearing members (22), each of said support shafts (21) having an actuator end, at the other end from said upper end (26)
  4) said support shafts driving said work supporting element 23 up in response to forces transmitted thereto from said vertical linear drive.

6. Apparatus for testing a semiconductor wafer with a test probe including
a test probe,
means for positioning said wafer along the Z axis in an X, Y and Z axis system relative to said test probe comprising,
a positioning system with X, Y, and Z axis motion,
a work supporting element (23) extending horizontally in a plane defined by said X and Y axes,
said element (23) being supported by a vertically extending lift means for moving said wafer supporting element (23) vertically along said Z-axis with respect to a main support member (60),
said lift means including a vertical elevator system comprising,
  1) a reciprocable vertical linear drive (41, 32),
  2) a plurality of vertically extending support shafts (21) carried reciprocably by cooperating bearing members (22), said bearing members (22) being secured to said main support member (60), with said support shafts (21) being supported by said bearing members (22) for vertical, reciprocable sliding up and down within said bearing members (22), each of said support shafts (21) having an actuator end, the other end (26) of each of said support shafts (21) being coupled at a different point to said wafer supporting element (23) for supporting a portion of the weight thereof,
  3) crank means for connecting forces to elevate said support shafts from said linear drive,
  4) said support shafts driving said wafer supporting element 23 up in response to force from crank means in response to said vertical linear drive.

7. Apparatus for positioning a work piece along the X, Y and Z axes in accordance with claim 1, including said different points being widely spread about the periphery of said wafer supporting element (23) and said support shafts (21) of said elevator elements being located beneath the periphery of said wafer supporting element (23).

8. Apparatus for testing a semiconductor wafer in accordance with claim 2, including
a motor (65) secured to said X-Y support, and
a linkage (62), (39), (31) between said motor (65) and said actuator ends (78) of said support shafts (21).

9. Apparatus for testing a semiconductor wafer with a test probe including,
a test probe,
means for positioning a semiconductor wafer along the X, Y and Z axes for probing by said probe comprising,
an X-Y work support (60),
a Z-plate (23) supported by means reciprocable along said Z axis including,
  a) a vertical drive shaft (32) reciprocating along said Z axis below said Z plate (23) connected to said X-Y support (60),
  b) a motor (65) linked to drive said vertical drive shaft (32),
  c) a set of crank arms (31) having the crank end (77) of each thereof engaged with said vertical drive shaft for providing cranking motion parallel to said Z axis, each of said crank arms (31) having an output end (78) distal from said crank end (31), and
  d) a set of elevator shafts (21) with each of said elevator shafts (21) supported at one end on said output end of a crank arm (31) and at the other end (26) said elevator shafts (21) supporting said Z-plate (23), said elevator shafts (21) being guided by bearing means (22) secured to said X-Y support for reciprocal elevator action to raise and lower said Z-plate (23) in response to said motor (65).

10. Apparatus for positioning a test probe relative to a semiconductor wafer along the Z axis in an X, Y and Z axis system comprising,
a test probe,
an X, Y, Z axis system, said apparatus including a horizontal surface wafer supporting element (23), said element (23) being supported by lift means for moving said wafer supporting element (23) vertically along said Z-axis with respect to a main support member (60), said lift means providing a vertical elevator system comprising, 1) a single reciprocable vertical linear drive (41, 32) and
2) a set of vertically extending support shafts (21) carried reciprocably by cooperating bearing members (22), each of said support shafts (21) having machined, pointed conical upper ends (26), each of said upper ends (26) being coupled at a different point to said wafer supporting element (23) for supporting a portion of the weight thereof, said different points being widely spread about the periphery of said wafer supporting element (23) and said support shafts (21) of said elevator elements being located beneath the periphery of said wafer supporting element (23),
3) said bearing members (22) being secured to said main support member (60), with said support shafts (21) being supported by said bearing members (22) for vertical, reciprocable sliding up and down within said bearing members (22), each of said support shafts (21) having an actuator end, at the other end from said upper end (26)
4) said support shafts driving said wafer supporting element 23 up in response to forces transmitted thereto from said vertical linear drive.

* * * * *